(12) United States Patent
Wong et al.

(10) Patent No.: US 7,800,434 B1
(45) Date of Patent: Sep. 21, 2010

(54) EDGE DETECT RECEIVER CIRCUIT

(75) Inventors: Thomas S. Wong, San Jose, CA (US);
Vincent Stueve, Round Rock, TX (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 12/420,006

(22) Filed: Apr. 7, 2009

(51) Int. Cl.
*H03K 5/00* (2006.01)
*H03K 5/08* (2006.01)

(52) U.S. Cl. .................. 327/552; 327/312; 327/306; 327/551; 327/558; 327/559; 327/24

(58) Field of Classification Search .............. 327/552, 327/312, 306, 317, 551, 558, 24, 559, 175, 327/72, 335, 289
See application file for complete search history.

(56) References Cited

U.S. PATENT DOCUMENTS

| 5,015,949 | A | * | 5/1991 | Koch et al. ............. 324/207.25 |
| 5,625,645 | A | * | 4/1997 | Greier et al. ................. 375/276 |
| 5,708,389 | A | * | 1/1998 | Gabara ......................... 327/552 |
| 6,084,537 | A | * | 7/2000 | Hardy et al. ................... 341/68 |
| 7,279,925 | B1 | * | 10/2007 | Richmond et al. ............ 326/27 |

* cited by examiner

*Primary Examiner*—Vibol Tan
(74) *Attorney, Agent, or Firm*—Patent Law Group LLP

(57) ABSTRACT

A digital signal detector detects digital signals by only sensing the rising and falling edges of a received digital signal and latches the logic state between the detected edges. Such edges contain very high frequencies that are much higher than the fundamental frequency of the digital signal train. A small high pass filter filters out at least the DC component and the fundamental frequency of the received digital signal. A filtered edge appears as a spike that goes either positive or negative depending on whether the edge is a rising or falling edge. A memory element, such as comprising an RS flip flop, is triggered by the positive and negative spikes. A positive spike triggers the flip flop to output a logical one, and a negative spike triggers the latch to output a logical zero. In this way, the digital signal is recreated without the original digital signal itself being required to pass through the high pass filter.

13 Claims, 3 Drawing Sheets input digital signal high pass filtered signal into Q1

Q4 output

Q3 output set output of 38 reset output of 38'

EDGE DETECT RECEIVER CIRCUIT

FIELD OF THE INVENTION

This invention relates to digital circuits and, in particular, to a DC-isolated receiver circuit that senses logical states of an incoming signal.

BACKGROUND

When a digital signal is transmitted from one system to another, such as over a cable or wirelessly, the digital signal becomes distorted due to noise and attenuation. To recover the digital signal for processing by the receiver, a digital signal detector is used. In a typical digital signal detector, the incoming "dirty" signal is compared to a threshold level, where the threshold level may be an average level detected over a relatively long period of time, and a logical one or zero is determined by whether the data signal is sufficiently higher than or lower than the threshold level. In other systems, the threshold is fixed.

In another application, a D-flip flop is used to create a clean digital signal, where the D-flip flop receives a clock signal and a data signal and latches in the data signal (above or below a fixed threshold) when the clock transitions high or low.

In many situations, it is desirable to provide DC isolation between two circuits, where the two circuits are from different systems. This is also referred to as AC coupling. In one example, a digital receiver head end, which receives a raw digital signal from a cable or wirelessly, is DC isolated from a detector circuit that determines whether the signal is a logical one or a logical zero. Since the DC offset of a digital signal is not relevant to the information being transmitted, such a DC offset can be filtered out. One type of DC filtering is a high pass filter formed of a capacitor in series with the signal path and a resistor connected between the downstream terminal of the capacitor and ground. The RC time constant of the filter determines the attenuation of the signal at a certain frequency. The DC component is totally blocked by the filter.

One problem with such DC isolation of the detector circuit is that some applications entail very low frequency pulses which must not be filtered. For example, a GPS system generates a 1 pulse per second (1 pps) signal that needs to be accurately received. If the 1 pps signal were needed to pass through the high pass filter while the filter blocked a DC level, the filter would require a very large filtering capacitor and/or a high value resistor to create a sufficiently high RC time constant (>>1 second). Such a large capacitor is impractical, and using such a high value resistor would not maintain signal integrity.

In some applications, a digital signal is transmitted over a low cost cable whose attenuation is highly dependent on frequency. A digital signal is composed of a wide range of frequencies having certain relative amplitudes, and recovering the digital signal may require an equalizer in the receiver that compensates for the frequency-dependent attenuation by the cable. Such an equalizer requires customized adjustment for each type of cable used.

What is needed is a digital signal detector that uses AC coupling to block DC, yet is practical for detecting a low frequency digital signal and is relatively insensitive to frequency-dependent attenuation by a cable.

SUMMARY

A digital signal detector is described that only detects the rising and falling edges of the digital signal. Such edges are composed of frequencies that are much higher than the fundamental frequency of the digital signal train. The detector uses a high pass filter that blocks DC and at least the fundamental frequency of the digital signal, such as the 1 pps GPS timing signals, yet allows the high frequencies associated with an edge to pass.

A filtered edge appears as a spike that goes either positive or negative depending on whether the edge is a rising or falling edge. A differential amplifier detects whether a spike goes positive or negative. A buffered output of the differential amplifier is coupled to an RS flip flop (or other suitable flip flop or latch) for latching in the state of the digital signal between the spikes. In this description, the term "latch" will refer to any bistable memory device, whether it be formed using a flip-flop or any other circuitry. A positive spike triggers the flip flop or latch to output a logical one, and a negative spike triggers the latch to output a logical zero. In this way, the digital signal is recreated without the original digital signal being required to pass through the high pass filter. The logic levels may be inverted depending on the particular circuits used. The differential amplifier is optional, but improves accuracy by providing a more definite triggering time. The latch may be any suitable memory element.

In one embodiment, the high pass filter comprises a capacitor in series between the input signal and one input of the differential amplifier. A resistor is connected at one end to the filtered output of the capacitor and connected at its other end to the other input of the differential amplifier and a DC threshold voltage. This creates a difference voltage at the inputs of the differential amplifier that triggers the amplifier output when the polarity of the edge spike reverses. The size of the capacitor is small since only high frequency signals need to be passed that signify an edge. Therefore, the same detector may be used with a wide range of digital signal fundamental frequencies.

BRIEF DESCRIPTION OF THE DRAWINGS

Elements labeled with the same numerals may be the same or similar.

DETAILED DESCRIPTION

Figure 1:
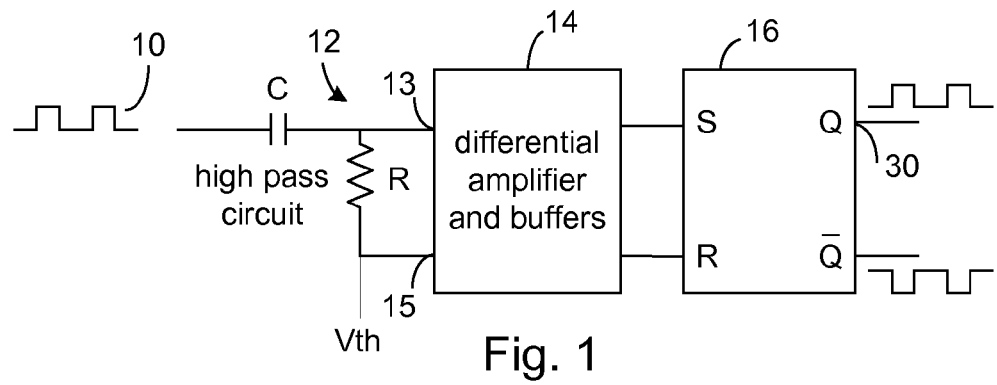
FIG. 1 depicts an edge detection receiver circuit for a single-ended input, in accordance with one embodiment of the invention.

In FIG. 1, a digital signal 10 is transmitted by a system for reception by the edge detection receiver 12. The digital signal 10 may have a DC offset. The signal 10 may be a 1 pps signal from a GPS satellite, or another digital signal.

The system that provides the digital signal 10 is DC isolated from the differential amplifier/buffers 14 by a capacitor C. The digital signal 10 is applied to one terminal of the capacitor C. The other terminal of the capacitor C is connected to a first input 13 of a differential amplifier within the differential amplifier/buffers 14. The capacitor C is also connected to a resistor R, which is connected in series to a second input 15 of the differential amplifier and to a DC threshold voltage Vth. The capacitor C and resistor R form a high pass filter. If the first input 13 is higher than the second input 15, the differential amplifier/buffers 14 apply a high set signal to the RS flip flop 16 to latch the Q output high. If the first input 13 is lower than the second input 15, the differential amplifier/buffers 14 apply a high reset signal to the flip flop 16 to latch the Q output low. The state of the Q-not output is the opposite of the Q output.

Figure 2A:
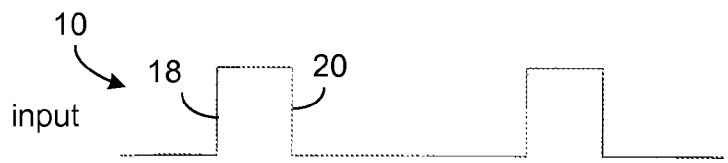
FIG. 2A illustrates a digital signal of any frequency applied to an input of the detector of FIG. 1 or 3.
Figure 2B:
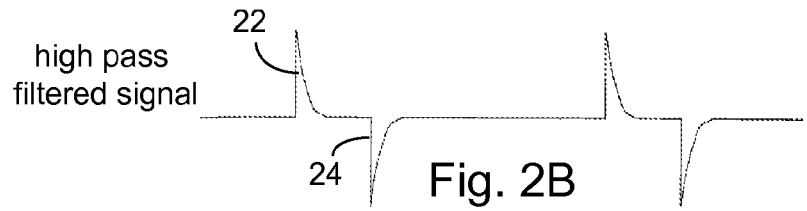
FIG. 2B illustrates the output of the high pass filter, where positive or negative spikes occur when the incoming digital signal transitions high or low.
Figure 2C:
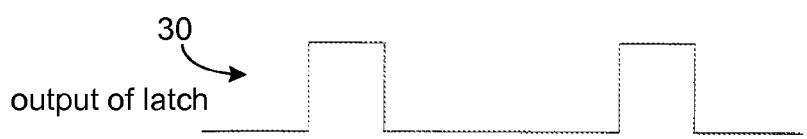
FIG. 2C illustrates the digital signal that is output by the memory element (e.g., a latch), which recreates the original digital signal based on the relative positions of its edges.

FIGS. 2A-2C are examples of waveforms generated during the operation of the circuit. A digital signal 10 applied to the capacitor C is shown in FIG. 2A. The signal 10 may have any fundamental frequency. The high pass filter is designed to block the fundamental frequency and pass only the high frequency components of the edges 18/20 of the digital signal 10. Such high frequency components will include harmonics of the fundamental frequency. Not all of the harmonics need to be passed in order to detect the edge. As long as the high pass filter allows some of the harmonics to pass, the output of the capacitor C will appear as a positive spike 22 (FIG. 2B) at the leading edge 18 of a digital pulse (i.e., the start of a logical one state) and will appears as a negative spike 24 (FIG. 2B) at the trailing edge 24 of the digital pulse (i.e., the start of a logical zero state). The magnitude of the spike is related to the rise and fall times of the edges 18 and 20, and the values of capacitor C and resistor R. Between the positive and negative spikes (where the positive spike occurs before the negative spike), the digital signal 10 is a logical one, and between the negative and positive spikes, (where the negative spike occurs before the positive spike), the digital signal 10 is a logical zero. In the waveforms of FIGS. 2A-2C, the waveforms proceed from left to right with time.

When there is a leading edge 18 (FIG. 2A) of the digital signal 10, a positive spike 22 (FIG. 2B) occurs at the input 13 of the differential amplifier/buffers 14. The resistor R is connected to the input 15 of the differential amplifier/buffers 14. Since the voltage spike causes input 13 to be higher than input 15, the differential amplifier/buffers 14 will be switched to apply a positive set signal to the set input of the flip flop 16. The polarities are not critical since polarities can always be inverted within the system. Therefore, the Q output 30 (FIG. 2C) of the flip flop 16 will be high to correspond to the state of the original digital signal 10.

Conversely, when there is a trailing edge 20 (FIG. 2A) of the digital signal 10, a negative spike 24 (FIG. 2B) results at the input 13 of the amplifier 14. Since the spike causes input 13 to be lower than input 15, the differential amplifier 14 will be switched to apply a positive reset signal to the reset input R of the flip flop 16. Therefore, the Q output 30 (FIG. 2C) of the flip flop 16 will be low to correspond to the state of the original digital signal 10.

Figure 3:
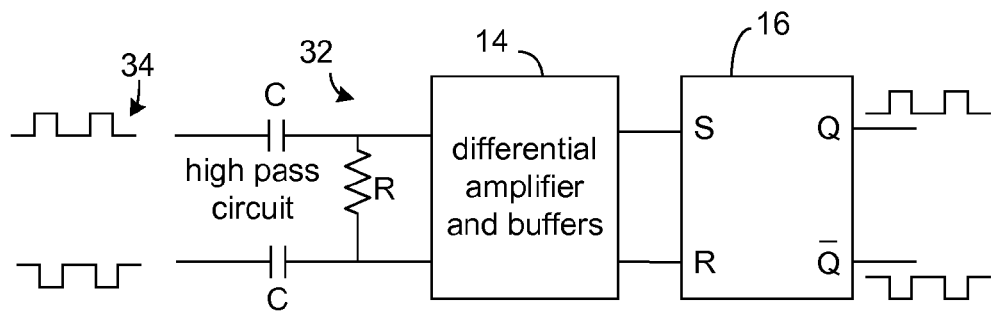
FIG. 3 depicts an edge detection receiver circuit for a differential input, in accordance with another embodiment of the invention.

FIG. 3 illustrates the edge detection receiver 32 having a differential digital input 34. The operation of the circuit is identical to that of FIG. 1, except that opposite polarity spikes are simultaneously applied to the two inputs of the differential amplifier 16 via the two high pass capacitors. This will effectively double the magnitude of the difference at the input of the differential amplifier 14 for a faster and more accurate trigger.

Figure 4:
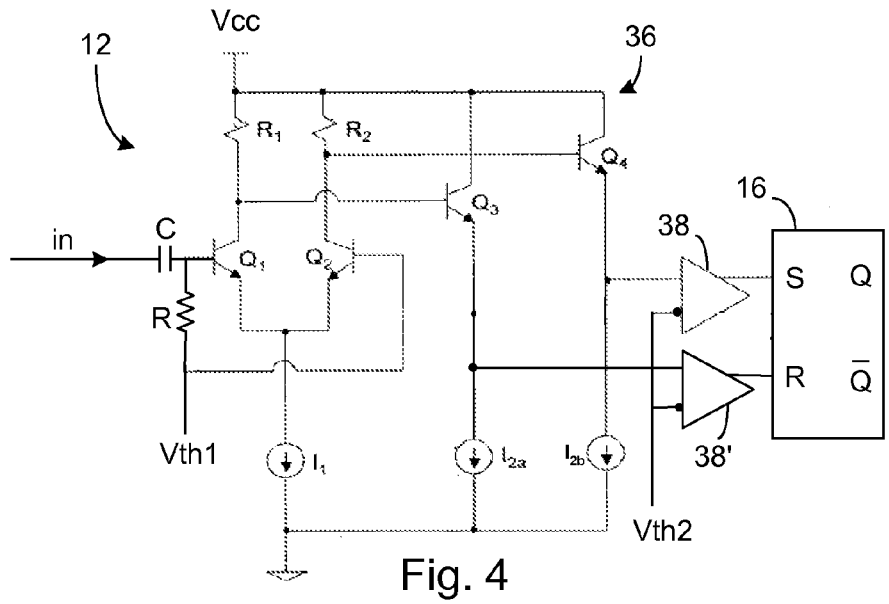
FIG. 4 illustrates a differential amplifier portion of the edge detection receiver circuit in accordance with one embodiment of the invention.
Figure 5A:
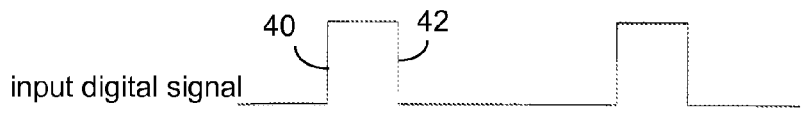
FIG. 5A illustrates a digital signal applied to an input of the high pass filter in FIG. 4.
Figure 5B:
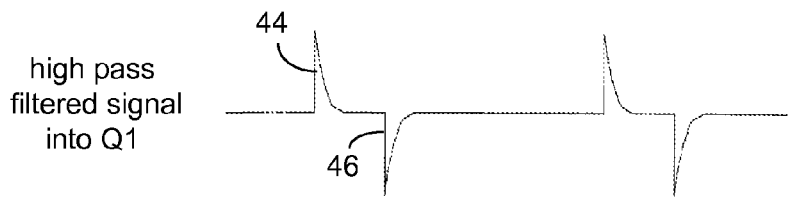
FIG. 5B illustrates the output of the filter applied to transistor Q1 in FIG. 4.
Figure 5C:
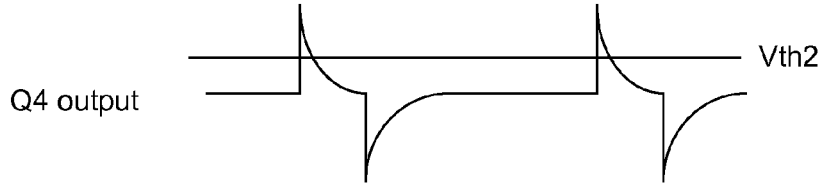
FIG. 5C illustrates the output of transistor Q4 (at its emitter) in FIG. 4.
Figure 5D:
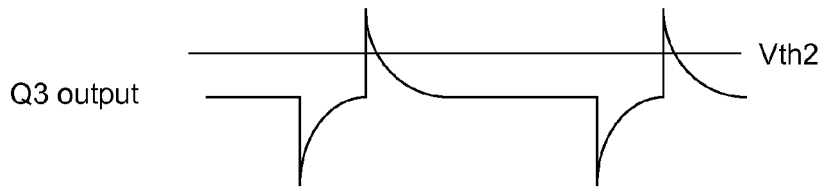
FIG. 5D illustrates the output of transistor Q3 (at its emitter) in FIG. 4.
Figure 5E:
FIG. 5E illustrates the output of the comparator 38 in FIG. 4.
Figure 5F:
FIG. 5F illustrates the output of the comparator 38' in FIG. 4.

FIG. 4 illustrates details of a differential amplifier 36 and buffers 38/38' that may form the differential amplifier/buffers 14 in FIGS. 1 and 3. I1, I2a and I2b are fixed current sources. FIGS. 5A-5F illustrate waveforms at various nodes in the circuit of FIG. 4.

Upon a leading edge 40 of a digital input signal, a positive voltage spike 44 is output from the capacitor C, signifying a leading edge. This causes transistor Q1 to be turned on and transistor Q2 to be turned off, since the voltage at the base of transistor Q1 is higher than the Vth1 voltage at the base of transistor Q2 due to the positive current flowing out of the capacitor C and through the resistor R. The turning on of transistor Q1 will draw a current through resistor R1 to create a low signal at the base of transistor Q3 and a high signal at the base of transistor Q4.

The high output of Q4 (FIG. 5C) is applied to an input of a comparator 38, whose other input is connected to a DC threshold voltage Vth2. The crossing of Vth2 causes a positive pulse (FIG. 5E) to be output from comparator 38 to set the RS flip flop 16. This causes the RS flip flop 16 to be set (Q=1), generating a logical one output signal.

When a negative voltage spike 46 (FIG. 5B) is output from the capacitor C, signifying a trailing edge 42, transistor Q1 is turned off and transistor Q2 is turned on, since the voltage at the base of transistor Q2 is higher than the voltage at the base of transistor Q1 due to the negative current flowing into the capacitor C and through the resistor R. This causes a high signal to be applied to the input of the comparator 38', causing the comparator 38' to apply a high reset signal to the flip flop 16 to switch its Q output to a logical zero.

In another embodiment, the differential amplifier is the "fail-safe" differential circuit described in US Patent Application Publication 2008/0024174, by Thomas Wong et al., assigned to the present assignee and incorporated herein by reference.

Figure 6:
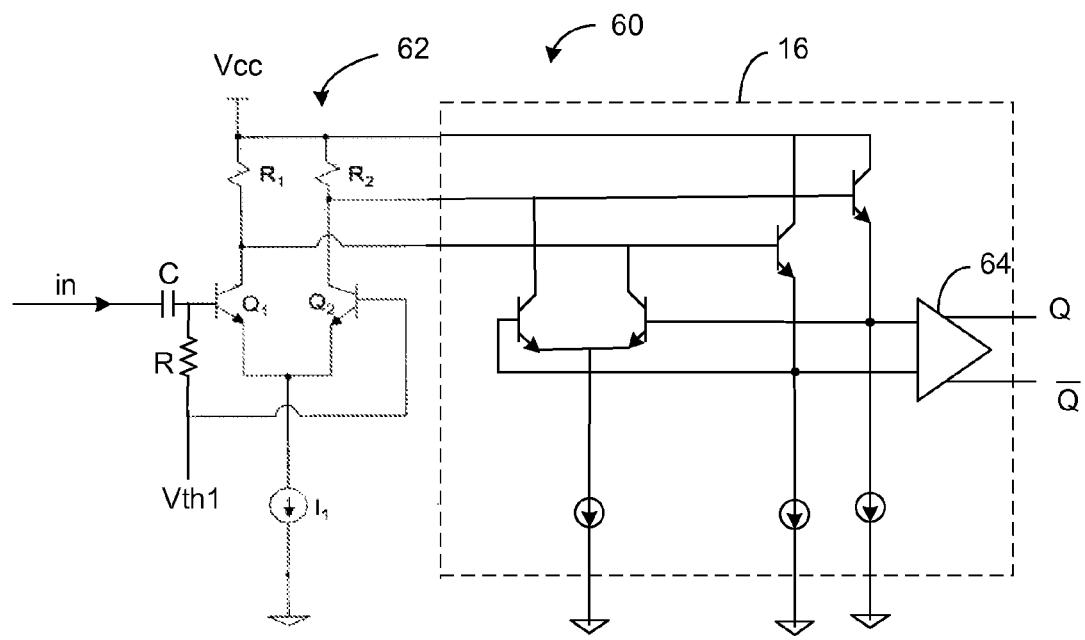
FIG. 6 illustrates an edge detector showing circuit details of an RS latch.

FIG. 6 illustrates an edge receiver 60 having an RC high pass filter connected to a differential amplifier 62 and showing additional detail of one type of RS flip flop 16. The construction and operation of such a flip flop 16 is well known. A differential buffer 64 outputs the Q and Q-not signals similar to the circuit of FIG. 1.

Figure 7:
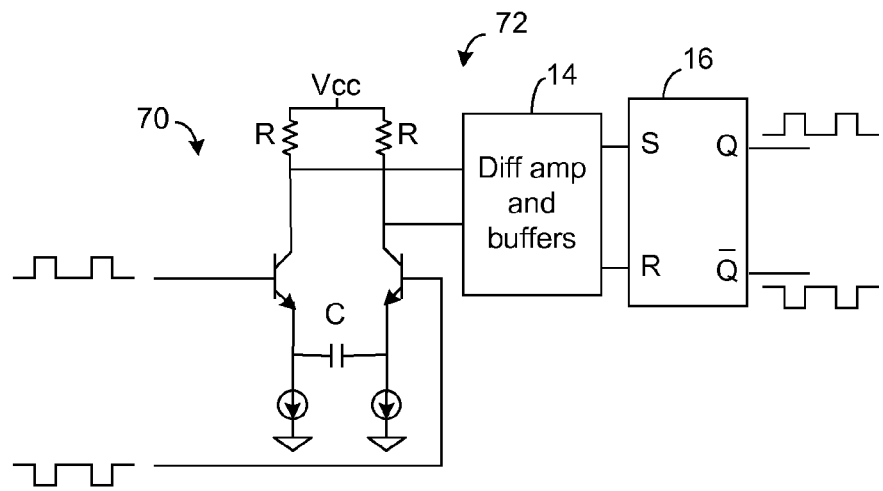
FIG. 7 illustrates an edge detector including details of a high pass filter, where its input impedance is substantially unrelated to the capacitor value.

FIG. 7 illustrates details of a high pass filter 70 where the capacitor C value does not substantially affect the input impedance of the edge detector 72. Therefore, the capacitor value can be tailored to achieve optimal filter characteristics for different systems without affecting the input impedance.

A seen, the edge detection receiver can recreate digital signals having a very wide range of fundamental frequencies, while providing DC isolation, since only the edges need to be detected. The capacitor(s) can be small since there are very high frequency components in the edge that can create the spike at the output of the filter.

The combination of the differential amplifier and latch is considered to be a memory element that latches in a high state upon detecting a filtered positive pulse and latches in a low state upon detecting a filtered negative pulse.

Other types of flip flops/latches may be used instead of an RS flip flop, as long as the differential amplifier/latch performs as a memory element to retain the state of the digital signal between the positive and negative spikes. The memory element may contain inverters to output a desired level of a particular logic state. In some circuit configurations, the differential amplifier may be deleted since the positive spike can be used to set the flip flop, and the negative spike can be used to reset the flip flop. The differential amplifier is used to amplify the filtered signal and improve the accuracy of the receiver by providing a more definite triggering time.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A digital signal receiver comprising:
    an input terminal for receiving an original digital signal;
    a high pass filter, connected to the input terminal, for at least filtering out a DC component and a fundamental frequency of the original digital signal and passing higher frequencies contained in an edge transition of the original digital signal, the high pass filter being configured to output a positive spike upon the original digital signal transitioning to a first logic state and output a negative spike upon the original digital signal transitioning to a second logic state, a level of the original digital signal between its edge transitions not being used by the receiver to detect a state of the original digital signal; and
    a memory element coupled to an output of the high pass filter, the memory element comprising a latch having a first data input connected to receive a pulse corresponding to the positive spike and a second data input connected to receive a pulse corresponding to the negative spike, such that the latch outputs the first logic state upon the high pass filter outputting the positive spike and outputs a second logic state upon the high pass filter outputting the negative spike, to substantially recreate the original digital signal from only the edge transitions of the original digital signal.

2. The receiver of claim 1 wherein the memory element comprises a differential amplifier receiving the positive and negative spikes, wherein an output of the differential amplifier is coupled to the latch.

3. A digital signal receiver comprising:
    an input terminal for receiving an original digital signal;
    a high pass filter, connected to the input terminal, for at least filtering out a DC component and a fundamental frequency of the original digital signal and passing higher frequencies contained in an edge transition of the original digital signal, the high pass filter being configured to output a positive spike upon the original digital signal transitioning to a first logic state and output a negative spike upon the original digital signal transitioning to a second logic state, a level of the original digital signal between its edge transitions not being used by the receiver to detect a state of the original digital signal; and
    a memory element coupled to an output of the high pass filter, such that the memory element outputs the first logic state upon the high pass filter outputting the positive spike and outputs a second logic state upon the high pass filter outputting the negative spike, to substantially recreate the original digital signal from only the edge transitions of the original digital signal,
    wherein the high pass filter comprises:
        a capacitor in series between the input terminal and a first input of the memory element; and
        a resistor connected between the first input of the memory element and a second input of the memory element for creating a difference signal between the first input and second input.

4. The receiver of claim 1 wherein the latch comprises a flip flop.

5. A digital signal receiver comprising:
    an input terminal for receiving an original digital signal;
    a high pass filter, connected to the input terminal, for at least filtering out a DC component and a fundamental frequency of the original digital signal and passing higher frequencies contained in an edge transition of the original digital signal, the high pass filter being configured to output a positive spike upon the original digital signal transitioning to a first logic state and output a negative spike upon the original digital signal transitioning to a second logic state, a level of the original digital signal between its edge transitions not being used by the receiver to detect a state of the original digital signal; and
    a memory element coupled to an output of the high pass filter, such that the memory element outputs the first logic state upon the high pass filter outputting the positive spike and outputs a second logic state upon the high pass filter outputting the negative spike, to substantially recreate the original digital signal from only the edge transitions of the original digital signal,
    wherein the input terminal comprises a differential input terminal, the differential input terminal comprising a first input terminal for receiving the original digital signal, and a second input terminal for receiving an inverted original digital signal;
    wherein the high pass filter comprises a first capacitor having a first end coupled to the first input terminal, a second capacitor having a first end coupled to the second input terminal, and a resistor coupled between second ends of the first capacitor and second capacitor,
    wherein a voltage spike at the second end of the first capacitor upon an edge transition of the original digital signal has a polarity that is opposite to a voltage spike at the second end of the second capacitor upon the edge transition of the original digital signal; and
    wherein the memory element has a first input coupled to the second end of the first capacitor and a second input coupled to the second end of the second capacitor.

6. The receiver of claim 1 wherein the high pass filter outputs a positive going spike when the original digital signal transitions to a logical high state and outputs a negative going spike when the original digital signal transitions to a logical low state.

7. A method of detecting logic states of an original digital signal comprising:
    receiving the original digital signal at an input of a high pass filter;
    filtering the original digital signal by the high pass filter, the high pass filter at least filtering out a DC component and a fundamental frequency of the original digital signal and passing higher frequencies contained in an edge transition of the original digital signal, the high pass filter outputting a positive spike upon the original digital signal transitioning to a high logic state and outputting a negative spike upon the original digital signal transitioning to a low logic state, a level of the original digital signal between its edge transitions not being used to detect a state of the original digital signal; and detecting the positive spike and the negative spike by a memory element coupled to the high pass filter, the memory element comprising a latch having a first data input connected to receive a pulse corresponding to the positive spike and a second data input connected to receive a pulse corresponding to the negative spike, such that the latch outputs the high logic state upon the high pass filter outputting the positive spike and outputs the low logic state upon the high pass filter outputting the negative spike, to substantially recreate the original digital signal from only the edge transitions of the original digital signal.

8. The method of claim 7 wherein detecting the positive spike and the negative spike by the memory element comprises:

receiving, by a differential amplifier, the positive and negative spikes; and controlling the latch by differential outputs of the differential amplifier.

9. The method of claim 7 wherein filtering the original digital signal by the high pass filter comprises:

filtering the original digital signal by a capacitor in series between the input terminal and a first input of the memory element.

10. A method of detecting logic states of an original digital signal comprising:

receiving the original digital signal at an input of a high pass filter;

filtering the original digital signal by the high pass filter, the high pass filter at least filtering out a DC component and a fundamental frequency of the original digital signal and passing higher frequencies contained in an edge transition of the original digital signal, the high pass filter outputting a positive spike upon the original digital signal transitioning to a high logic state and outputting a negative spike upon the original digital signal transitioning to a low logic state, a level of the original digital signal between its edge transitions not being used to detect a state of the original digital signal; and detecting the positive spike and the negative spike by a memory element coupled to the high pass filter, such that the memory element outputs the high logic state upon the high pass filter outputting the positive spike and outputs the low logic state upon the high pass filter outputting the negative spike, to substantially recreate the original digital signal from only the edge transitions of the original digital signal, wherein filtering the original digital signal by the high pass filter comprises:

filtering the original digital signal by a capacitor in series between the input terminal and a first input of the memory element, and coupling the filtered original digital signal to a resistor connected between the first input of the memory element and a second input of the memory element.

11. A method of detecting logic states of an original digital signal comprising:

receiving the original digital signal at an input of a high pass filter;

filtering the original digital signal by the high pass filter, the high pass filter at least filtering out a DC component and a fundamental frequency of the original digital signal and passing higher frequencies contained in an edge transition of the original digital signal, the high pass filter outputting a positive spike upon the original digital signal transitioning to a high logic state and outputting a negative spike upon the original digital signal transitioning to a low logic state, a level of the original digital signal between its edge transitions not being used to detect a state of the original digital signal; and detecting the positive spike and the negative spike by a memory element coupled to the high pass filter, such that the memory element outputs the high logic state upon the high pass filter outputting the positive spike and outputs the low logic state upon the high pass filter outputting the negative spike, to substantially recreate the original digital signal from only the edge transitions of the original digital signal, wherein detecting the positive spike and the negative spike by the memory element comprises detecting the positive spike and the negative spike by a flip flop, where a positive spike sets the flip flop and a negative spike resets the flip flop.

12. The method of claim 7 wherein detecting the positive spike and the negative spike by the memory element comprises detecting the positive spike and the negative spike by the latch, where a positive spike triggers the latch to output the first logic state, and where a negative spike triggers the latch to output the second logic state.

13. The method of claim 7 wherein the input terminal comprises a differential input terminal, the differential input terminal comprising a first input terminal for receiving the original digital signal, and a second input terminal for receiving an inverted original digital signal;

wherein filtering the original digital signal by the high pass filter comprises high pass filtering, by a first high pass filter node coupled to the first input terminal, the original digital signal to generate a spike upon an edge transition of the original digital signal, and high pass filtering, by a second high pass filter node coupled to the second input terminal, an inverted original digital signal to generate a spike upon an edge transition of the inverted original digital signal, the spike generated by the first high pass filter node having a polarity opposite to the spike generated by the second high pass filter node upon the edge transition of the original digital signal and the inverted original digital signal.

* * * * *